United States Patent [19]

Tanaka et al.

[11] 4,348,911

[45] Sep. 14, 1982

[54] PUSHBUTTON

[75] Inventors: Yoshio Tanaka; Yasuhisa Nishikawa; Ryoichi Hasumi, all of Toda, Japan

[73] Assignee: Clarion Co., Ltd., Japan

[21] Appl. No.: 102,421

[22] Filed: Dec. 11, 1979

[30] Foreign Application Priority Data

Dec. 13, 1978 [JP] Japan .................. 53-153221
Dec. 18, 1978 [JP] Japan ............... 53-172141[U]
Dec. 19, 1978 [JP] Japan ............... 53-173109[U]
Feb. 22, 1979 [JP] Japan ............... 54-021009[U]

[51] Int. Cl.³ .................. H03J 5/12; F16D 13/50
[52] U.S. Cl. .................. 74/10.33; 192/65; 192/74; 192/89 B; 334/7
[58] Field of Search .......... 74/10.33, 10.37; 334/7; 192/65, 74, 89 B

[56] References Cited

U.S. PATENT DOCUMENTS

| | | | |
|---|---|---|---|
| 2,707,108 | 4/1955 | Schottler | 192/65 |
| 3,640,363 | 2/1972 | Spalding | 192/89 B X |
| 3,863,509 | 2/1975 | Zimatore et al. | 74/10.33 |
| 3,946,344 | 3/1976 | Wilkinson | 74/10.33 X |
| 4,118,992 | 10/1978 | Yamagishi | 74/10.33 |
| 4,187,729 | 2/1980 | Kanai et al. | 74/10.33 |

Primary Examiner—Allan D. Herrmann
Attorney, Agent, or Firm—Wallenstein, Wagner, Hattis, Strampel & Aubel

[57] ABSTRACT

A pushbutton tuner comprising button slides disposed within a plane in parallel with a baseplate and link members operable by setting pins provided on the respective button slides also disposed within a plane in parallel with the baseplate. A memory slide is displaced by rotation of a free end of each link member when the setting pin moves rearwardly. Each of the link members is so disposed that a line drawn between its portion where it is pivotally connected to the basetable and its portion where it is pivotally engaged with the memory slide is parallel with the rearward movement of the setting pin. The link members each have symmetrically convexed engaging edges at opposite sides thereof. In the position where the link members are disposed on the baseplate so as to be close each other, the setting pins are adapted to act on the adjacent engaging edges of the link members.

10 Claims, 25 Drawing Figures

PUSHBUTTON

TECHNICAL FIELD

This invention relates to a pushbutton tuner, and more particularly to a thinned-type pushbutton tuner employing specific link members, which is capable of reducing a force required for operating the tuner and simplifying the structure of the pushbutton tuner. The pushbutton tuner is further capable of achieving desired selection operation without substantial tuning error and yet capable of further reducing the entire thickness of the pushbutton tuner.

BACKGROUND ART

In a pushbutton tuner, it is essential to achieve a desired selection or tuning operation simply by depressing a push button. To satisfy this requirement, there have been proposed various mechanisms. On the other hand, where the pushbutton tuner is used in automobiles as a car equipment, it should be compact, especially thin to be suitably assembled with other equipment and mounted within a limited space effectively. Various structures have been proposed to reduce a thickness of the pushbutton tuner. In general, a desired structure to reduce the thickness of the pushbutton tuner is such that the button slides are arranged in a plane parallel with a baseplate and link members are also arranged in a plane parallel with the baseplate so as to be operated by setting members provided on the button slides. More specifically, a plurality of link members are crossingly arranged in relation with a pin of each of the setting members and free ends of the link members are rotatable upon retreat of the setting pin to displace a memory slide. The inventors of the present invention have also proposed heretofore this type of structures suitable for an automobile car pushbutton tuner of a reduced thickness. In fact, this type of the structure, wherein crossingly arranged link members are employed, is generally desirable to reduce the thickness of the tuner. However, the structure needs at least two link members for each button slide and accordingly the number of components are inevitably large. In addition, a line drawn between a portion where the link member is pivotally connected to the baseplate and a portion where the link member is pivotally connected to the memory slide crosses a direction of retreat of the memory pin. In other words, since the free ends of the link members, whose base ends are pivotally connected to the baseplate on opposite sides of the respective button slide, are crossed and overlap each other in a direction of retreat of the memory pin, there is a considerable loss in force for displacement of the memory slide by a component force of the pushing force of the memory pin as can be understood from analysis of trignometry when the mechanism is viewed from above the same. Therefore, there has been proposed a slot on the link member of arcuate shape which receives the merory slide pin. This can overcome the disadvantage of the loss in the operating force, but causes another disadvantage of turning error.

SUMMARY OF THE INVENTION

It is therefore an object of the present invention to provide a pushbutton tuner free from the abovementioned disadvantages and capable of readingly attaining an operation of a memory slide without causing a tuning error.

In accordance with the present invention, there is provided a pushbutton tuner which comprises:
a baseplate;
a plurality of button slides arranged within a plane in parallel with a major face of the baseplate;
setting pins provided on the button slides, respectively;
a plurality of link members pivotally supported on said major face of the baseplate within a plane or planes in parallel therewith in relation with the respective button slides;
a tuning mechanism; and
a memory slide engaged with said link members for operating said tuning mechanism;
said memory slide being displaceable upon rotation of any of the link members which has been actuated through an engagement thereof with the associated setting pin in response to depression of the associated button slide;
the lines each drawn between a portion where the link member is pivotally connected to the baseplate and a portion where said link member is pivotally connected to the memory slide being parallel with each other.

BRIEF DESCRIPTION OF THE DRAWINGS

FIGS. 5(A), (B) and (C) are views showing one of the link members shown in FIGS. 1 and 2; (A) being a perspective view of the link member; (B) being a vertical sectional view of one form of the projection portion thereof; and (C) being a similar vertical sectional view of another form of the projection portion thereof;

PREFERRED EMBODIMENT OF THE INVENTION

Figure 1:
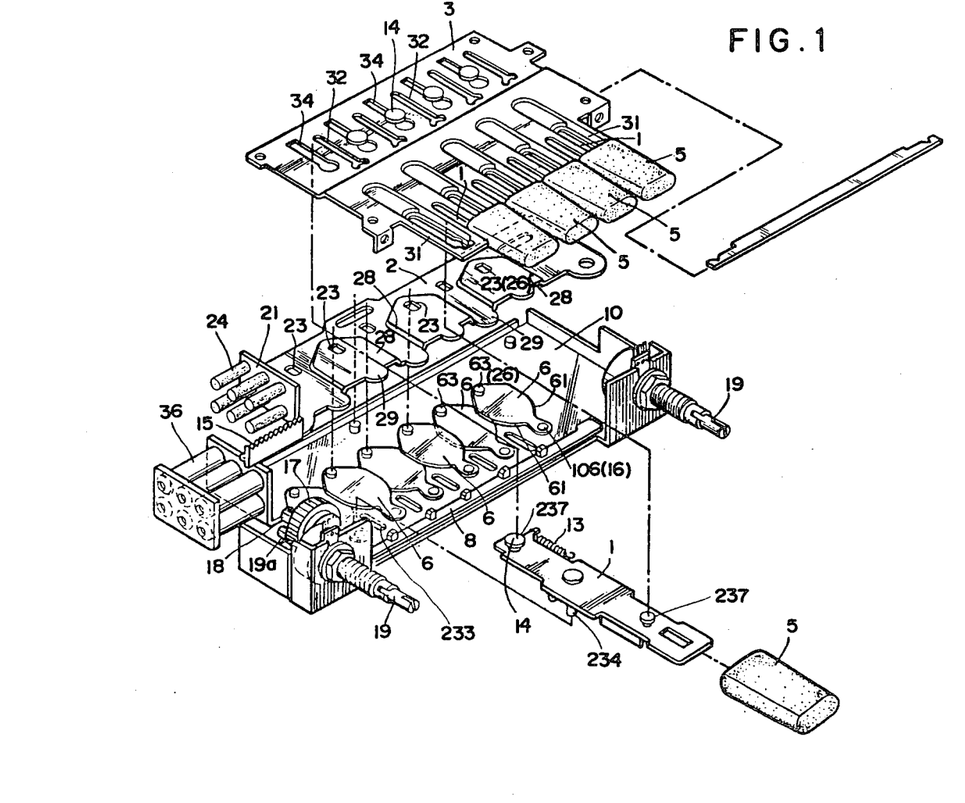
FIG. 1 is an exploded perspective view of one form of a pushbutton tuner in accordance with the present invention.
Figure 2:
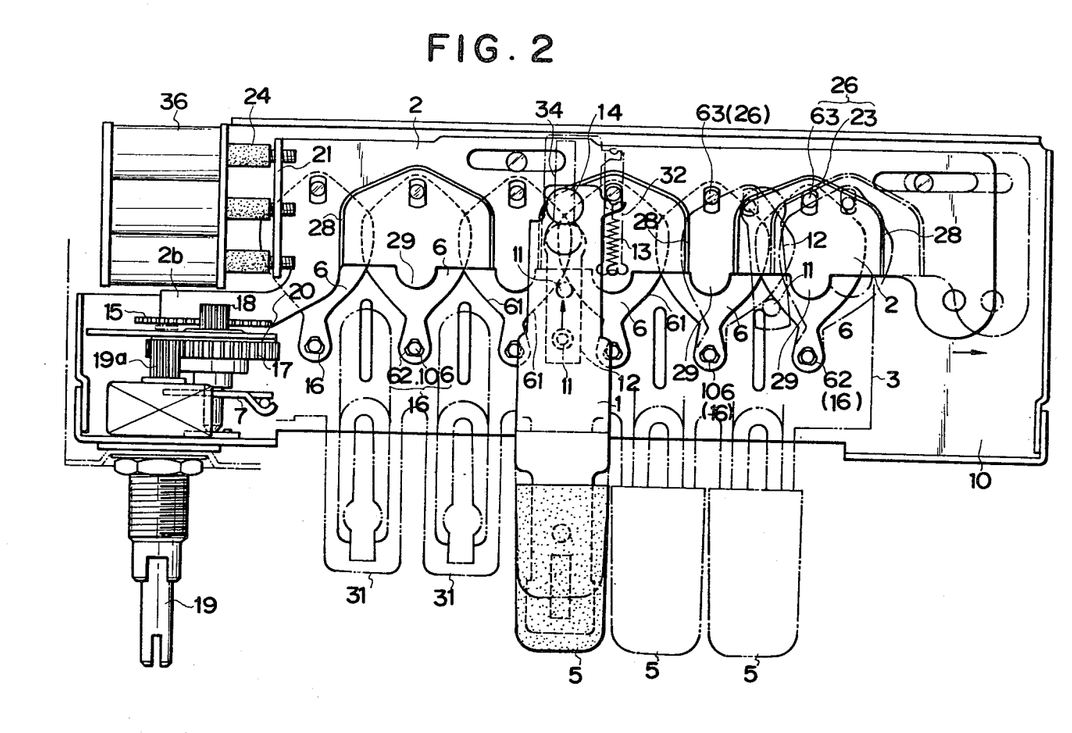
FIG. 2 is a plan view of the pushbutton tuner illustrated in FIG. 1.
Figure 3:
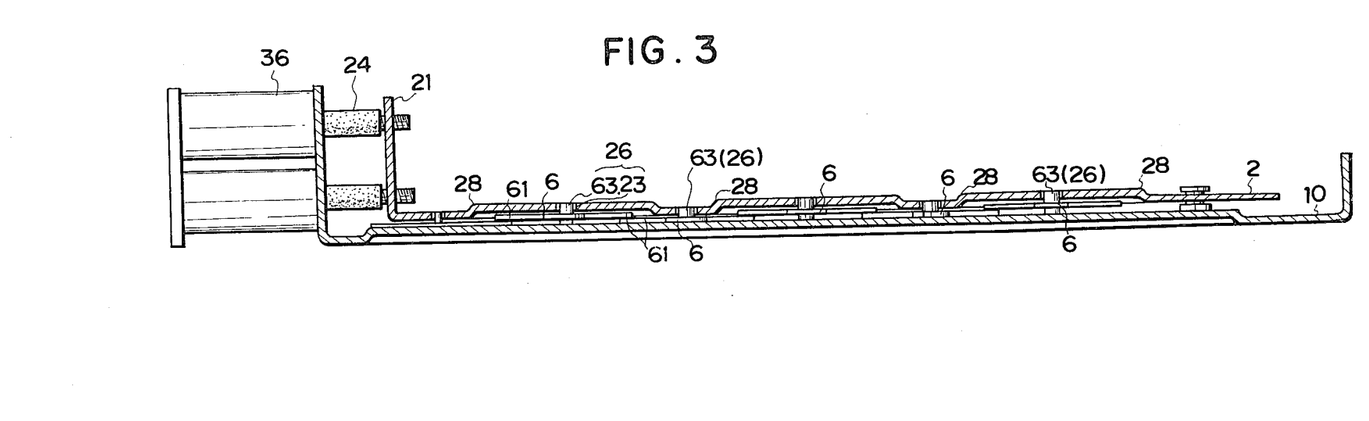
FIG. 3 is a cross sectional elevational view of the pushbutton tuner illustrated in FIG. 1, taken at a memory slide portion thereof.

Referring now to the drawings, especially FIGS. 1 to 3, there is illustrated a preferred form of a pushbutton tuner in accordance with the present invention. In the pushbutton tuner, a plurality of button slides 1 fitted at respective base ends with push buttons 5 are arranged within a plane parallel with a major face of a baseplate 10, and link members 6 are arranged in association with the respective button slides 1. In accordance with the present invention, a pair of link member 6 is provided on opposite side of each button slide, one such link member being shared by each adjacent pair of button slides, as illustrated in FIG. 1. Therefore, as different from known pushbutton tuners where the number of link members is, the link members as much as twice the number of the button slides 1, 1 the number of link members 6 is the number of button slides 1 plus 1. Each of the link members 6 is so disposed that a straight line connecting a portion where it is pivotally connected to the baseplate 10 and a portion where it is engageable with a memory slide 2 is parallel with the path of movement of a setting pin 11 provided on each button slide 1 in a normal set position (a position where the link members 6 are not biased), as illustrated in FIG. 2. Each of the link members 6 has an intermediate portion convexed symmetrically to define engaging edges 61 at opposite sides thereof. The so formed link members 6 are arranged closely to each other as illustrated in FIG. 1 and adapted to be engaged, at the respective engaging edges 61 thereof, by the setting pin 11 associated with the associated actuated push button 5.

In the embodiment illustrated in FIGS. 1 to 3, each setting pin 11 is provided on a setting member 12 which is pivotally supported at a base end thereof by the respective button slide 1. The setting member 12 is fixed or rendered movable relative to the button slide 1 through a restraining metal member and a resilient member so as to adjust and preset a setting angle of the setting member 12 with respect to the button slide 1 as in a general slide mechanism of this type. A top plate 3 is fitted to the baseplate 10. The top plate 3 has extensions 31 at a forward portion thereof for guiding operation of the push buttons 5. As illustrated in FIG. 1, the pushbuttons 5 are fitted to the respective guide extensions 31 and button slides 1. The top plate 3 further has, at an interior portion thereof, openings 32 for receiving therein springs 13, respectively, which are anchored on the respective button slides 1 so as to urge the button slides forwardly. A large-headed guide 14 provided at a rear portion of the respective button slide 1 is adapted to engage with a guide slot 34 formed at the interior portion of the top plate 3 between each two spring receiving openings 32 for guiding depression and resetting of the button slide 1.

The memory slide 2 has an upright portion on one side thereof for mounting a core 24 thereon. The core 24 is adapted to be inserted into a coil 36 provided on one side of the baseplate 10 as illustrated in FIGS. 2 and 3. The memory slide 2 further has, at the one side portion thereof, an extended portion 2b having a rack 15. A pinion 18 coaxial with a gear 17 is in mesh with the rack 15. The gear 17 is in mesh with a pinion 19a of a fine tuning shaft 19 for a manual rotary operation and adapted to effect the tuning operation by rotating the fine tuning shaft 19. A clutch mechanism 20 is provided between the gear 17 and the pinion 18 so that in a selection operation by depressing the push button 5, a clutch lever 7 is operated by the actuation of a kick arm 4 to release the interlocking between the gear 17 and the pinion 18.

In the embodiment illustrated in FIGS. 1 to 3, at the portion 16 where the link member 6 is pivotally mounted on the baseplate 10, a slot 62 having a shape of the combination of a circle and a regular triangle, as depicted in FIG. 2, is formed at a base portion of the link member 6 and a circular engaging projection 106 of the baseplate 10 is fitted in the slot 62. Such an arrangement of the pivotal portion 16 assures smooth displacement of the link member when the setting pin 11 acts on the engaging edge 61. On the other hand, at the pivotal portion 26 relative to the memory slide 2, a circular engaging projection 63 formed on the link member 6 is engaged with an elongated slot 23 of the memory slide 2. The link members 6 are mounted with the convexed engaging edges 61 formed on the opposite sides thereof being partly overlapped each other as illustrated in FIGS. 2 and 3. The overlapping arrangement of the convexed engaging edges 61 assures displacement of a selected link member 6 by the associated setting pin 11. In this case, the heights of the circular engaging projections 63 from the baseplate 10 are differentiated as illustrated in FIG. 3. To assure the engagement between the circular engaging projections 63 and the respective elongated slots 23 and to allow employment of the link members 6 of the same structure, the memory slide 2 has a raised portion 28 corresponding to every other link member 6 as illustrated in FIGS. 2 and 3 and the elongated slot 23 is formed on the raised portion 28 so that the pivotal connecting portions 26 may be staggered. Since the area of each raised portion 28 should be large enough to allow displacement of the link member accommodated in the raised portion 28, the raised portion 28 has a sufficient width for this purpose as viewed in FIG. 3. The memory slide 2 further has arcuate projections 29 at a forward end of the memory slide 2 at positions corresponding to the respective link members 6 mounted in positions so as to prevent possible deflection of the link members 6 in a direction of the thickness when any of the link members 6 is rotated by the setting pin 11.

Figure 4:
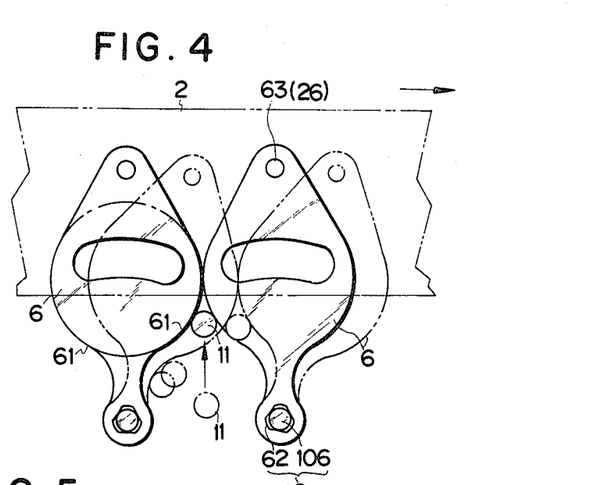
FIG. 4 is a fragmentary plan view of a pair of link members employable in the present invention which are modified forms of the link members shown in FIGS. 1 and 2.
Figure 7:
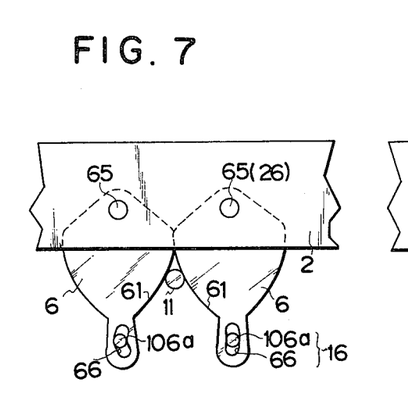
FIG. 7 is a fragmentary plan view of another form of engagement between the link members and a baseplate.
Figure 8:
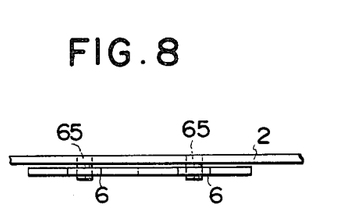
FIG. 8 is an end view of the engagement illustrated in FIG. 7.
Figure 11:
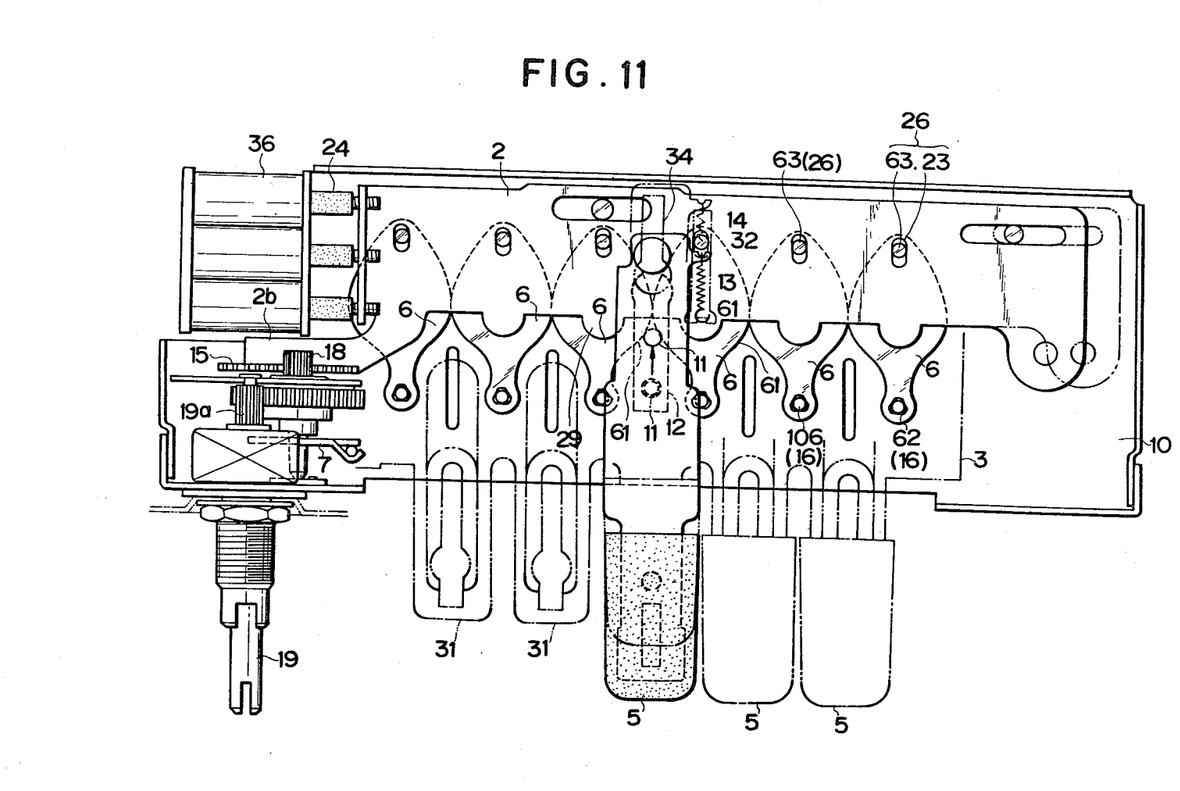
FIG. 11 is a plan view of another form of the pushbutton turner in accordance with the present invention wherein the link members illustrated in FIG. 4 are employed.
Figure 12:
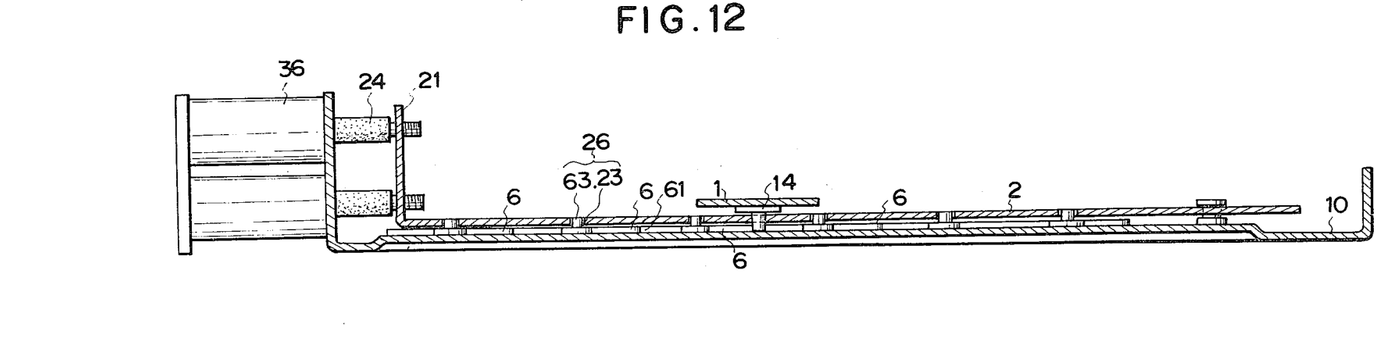
FIG. 12 is a sectional view of the pushbutton tuner illustrated in FIG. 11.
Figure 13:
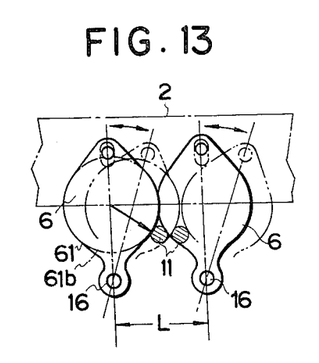
FIGS. 13 to 16 are views showing the operation of the pushbutton tuner illustrated in FIG. 11.
Figure 14:
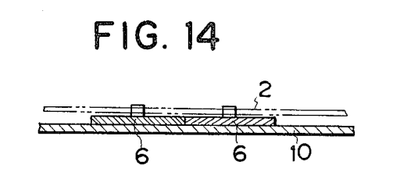
Figure 15:
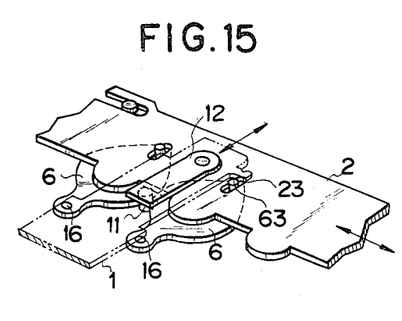
Figure 16:
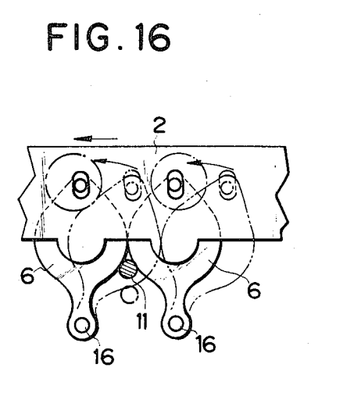
Figure 17:
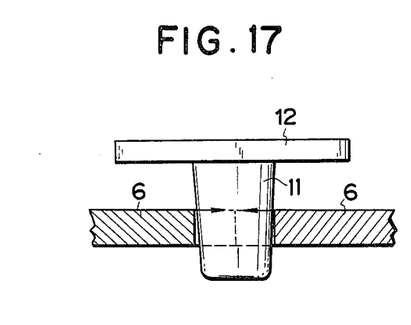
FIG. 17 is an enlarged sectional view showing the action of a setting pin on the link members.

In modified embodiments of the present invention, the link members 6 may be arranged without overlapping their convexed engaging edges 61 as illustrated in FIGS. 1 to 3. More specifically, such modifications are illustrated in FIGS. 4, 7 and 8. The structure of FIG. 4 is mounted in a pushbutton tuner as illustrated in FIGS. 11 and 12. According to the link member arrangement of FIG. 4, convexed engaging edges 61 and 61 formed symmetrically on opposite sides of the respective link member 6 have curvatures in conformity with a circle 61b within an area where the setting pin 11 is engageable therewith as illustrated in FIG. 13. The so formed link members 6, 6 . . . are disposed within a plane relative to the baseplate 10. Since the link members 6 are formed in the same configuration and size in this embodiment, the radius of the circle 61b is substantially L/2 when the interval between adjacent two link members 6 is assumed as L. Thus, the engaging edges 61, 61 of the adjacent link members 6 are preferably as close as they contact each other as illustrated in FIGS. 13, 14, 15 and 16 or spaced only by a distance less than the width of the setting projection 11. In case the link members 6 are disposed within the same plane, there is no longer needed to form the raised portions 28 on the memory slide 2. Thus, the increase in thickness due to the formation of the raised portions 28 can be avoided as can be seen upon comparison between FIGS. 3 and 12. The increase in thickness due to the raised portions 28 substantially corresponds to a thickness of the link member 6 and a space for allowing the link member to rotate therein. Although the thickness of the link member 6 is at largest 1 mm, the reduction in thickness is 1 mm which is significant to reduce the thickness of the entire length of the pushbutton tuner when it is considered that the entire thickness of the pushbutton tuner at the related portion is at most 4 to 5 mm as can be seen from FIG. 3. This reduction in thickness will never lead to decrease in strength and will even enhance the strength because of more compact packaging of the components as compared with the embodiment of FIG. 3 where the components are mounted leaving spaces therebetween. Furthermore, the link members 6 can symmetrically act on the respective setting pins 11 at a same height from the respective base ends thereof as can be seen from FIG. 17 to obtain a uniform operating force which is desirable for carrying out proper tuning operation.

Figure 5:
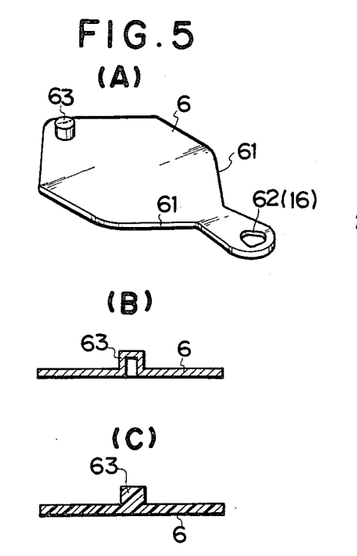

Although it is apparent that the engaging projection 63 on the link member 6 may be a member such as a pin which is formed separately from the link member 6 and fixed thereto by caulking, the engaging projection 63 is preferred to be so formed as illustrated in FIG. 5 wherein the engaging projection 63 is integrally formed with the link member 6 by punching as illustrated in FIG. 5(B) or integrally molded as illustrated in FIG. 5(C). The formation of FIG. 5(B) is suitable for a case where the link member 6 is made of a sheet metal and the formation of FIG. 5(C) is suitable for a case where the link member 6 is made of a synthetic resin. In either case, since the engaging projection 63 is formed integrally with the link member 6, there is no need to provide a separate member such as a pin and to further subjecting the link member to opening and caulking process. Furthermore, possible breakdown in the fixing structure formed by caulking can be avoided.

Figure 6:
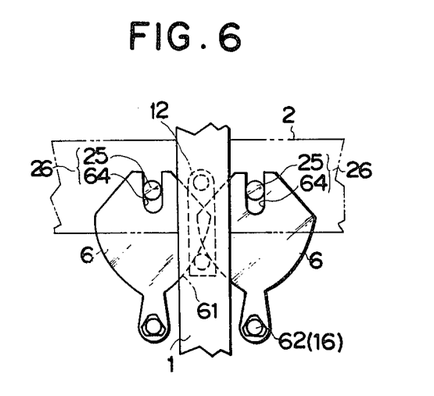
FIG. 6 is a fragmentary plan view of another form of engagement between the memory slide and the link members.

As for the engaging between the memory slide 2 and the link member 6, an elongated slot 64 may be formed on the link member as illustrated in FIG. 6 and engaged with a circular projection 25 formed on the memory slide 2. In this case, although a pin, a separate member may be employed for the circular projection 25 of the memory slide 2, it is preferred to form such a circular projection 25 integrally with the memory slide 2.

Further in accordance with the invention, the memory slide 2 is rotatably connected to the link member 6 by a pin 65 as illustrated in FIGS. 7 and 8. In this arrangement, at the portion for pivotally connecting the link member 6 to the baseplate 10, an elongated slot 66 may be formed on the link member 6 and engaged with a pin 106a provided on the baseplate 10. In this case, since the link member 6 slidingly rotates relative to the pin 106 according to the sliding of the memory slide 2, if the link members 6 are arranged so that arcuate convexed edges may be in contact with each other, the link operation parallel with the memory slide 2 and the baseplate 10 during the actuation of the setting pin 11 is by no means prevented.

Figure 9:
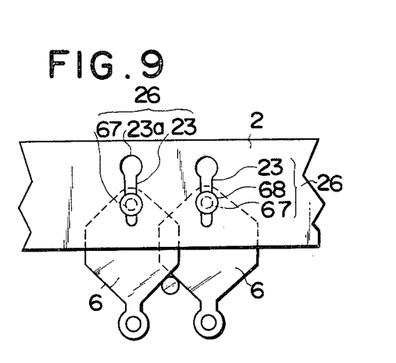
FIG. 9 is a fragmentary plan view of a still another form of the engagement between the memory slide and the link members.
Figure 10:
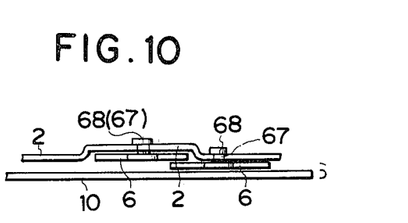
FIG. 10 is a side view of the engagement illustrated in FIG. 9.

As for the engagement between the link member 6 and the memory slide 2, a pin 67 with a large head may be alternatively be employed as illustrated in FIGS. 9 and 10. In this case, an elongated slot 23 on the memory slide 2 has at one end thereof an enlarged portion 23a for letting the large head 68 of the pin 67 pass therethrough so as to facilitate operations for assembling or repairing the link members with the pins 67. The employment of the pin 67 having the large head 68 as illustrated in FIGS. 9 and 10 regulates the engaging position of the link member 6 and the memory slide 2. More specifically, when the setting pin 11 acts on the link member 6, the link member 6 is regulated so as not to deflect in a direction of thickness of the link member 6. Therefore, instability of the memory slide due to such a deflection in the direction of the thickness of the link member and resultant tuning error can be avoided.

Figure 18:
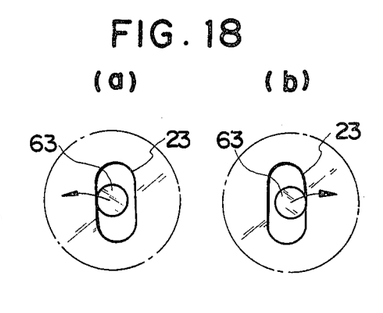
FIG. 18 is a view showing the operational relation between the engaging link member projections and memory slide slots into which they extend.

In the present invention, if a space is left between the slot 23 of the memory slide 2 and the engaging projection 63 fitted therein, the desired tuning can be attained as will be understood from FIG. 18. The setting pin 11 first acts on either one of the assoicated two link members 6. When the link member 6 is actuated with the engaging projection 63 acting on one side of the elongated slot 23 as illustrated in FIG. 18(a) under the conditions where the space is left as mentioned above, the engaging projection 63 of the adjacent link member 6 acts on the opposite side of the adjacent slot 23 through the memory slide 2 as illustrated in FIG. 18(b) to displace the link member 6 in the same direction. At the end of the setting operation, since the setting pin 11 in the depressed position is pressed by the engaging edge 61 of the adjacent link member 6 as illustrated in FIGS. 2, 4, 13 and 16, an operating force in a direction indicated by an arrow in FIG. 18(b) which is opposite to an operating force in a direction indicated by an arrow in FIG. 18(a) obtained by the engaging projection 63. Thus, the tuning operation can be carried out by a constantly balanced operating force.

Figure 19:
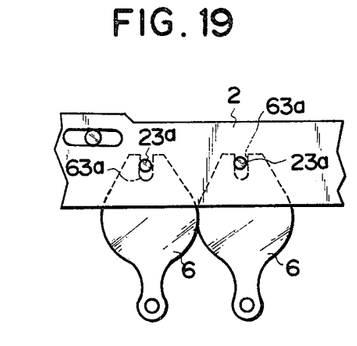
FIG. 19 is a fragmentary plan view of a still further form of the engagement between the memory slide and the link members.
Figure 20:
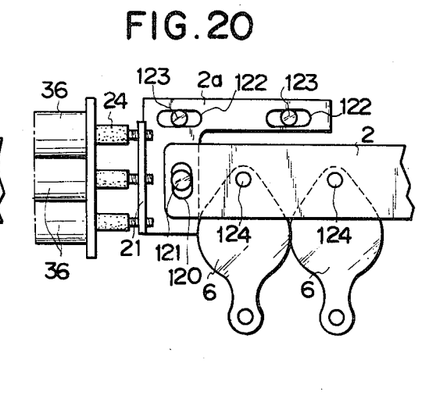
FIG. 20 is a similar fragmentary plan view of a still further form of the engagement between the memory slide and the link members.

The present invention is also operative in a modified structure as illustrated in FIGS. 19 and 20. In FIG. 19, the link member 6 has an elongated cutout 63a formed at a rear end portion thereof and the memory slide 2 has a projection 23a engageable therewith. On the other hand, where it is not suitable to provide an elongated slot or groove, there is provided a slide member 2a having an upright 21 on which the core 24 is mounted as illustrated in FIG. 20. The slide member 2a is engaged with the baseplate 10 through an engagement between an elongated slot 122 formed on the slide member 2a and a pin 123 provided on the baseplate 10. A pin 121 provided on the slide member 2a is engaged with an elongated slot 120 of the memory slide 2 which extends in a direction perpendicular to the slot 122. In this case, the link members 6 and the memory slide 2 are connected simply by pivots 124.

As apparent from the foregoing description, in accordance with the present invention, specific link members having symmetrically convexed engaging edges are employed and the link members are arranged so that the lines connecting the portions for connecting the respective link members to the baseplate and the portions for connecting the respective link members to the memory slide are in parallel with the displacing direction of the setting pins. Therefore, not only the number of the required link members can be reduced to substantially half as compared with the conventional link mechanism of a pushbutton tuner, but the operation of the memory slide can be done effectively through actuation of the link member by the setting pin to attain a tuning operation with a little force. Thus, the link mechanism of the pushbutton tuner in accordance with the present invention can provide an accurate operation by the simplified structure comprised of a reduced number of components and can reduce the entire thickness of the tuner. Where the link members are arranged in the same plane relative to the baseplate, the link members can have operative positions at the same height relative to the respective setting pins, so that not only the tuning operation by the setting pin can be effected uniformly, but also the thickness of the pushbutton tuner can be further reduced.

Figure 24:
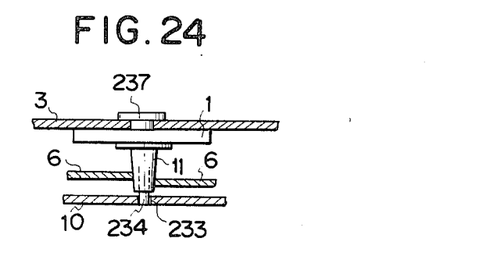
FIG. 24 is a sectional elevational view of a button slide guide mechanism employable in the pushbutton tuner of the present invention.
Figure 25:
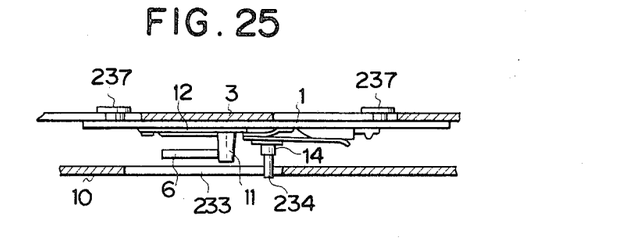
FIG. 25 is a sectional side view, of the button slide guide mechanism illustrated in FIG. 24.

As an example of a button slide guiding mechanism employable in the embodiments of the present invention as mentioned above, there can be mentioned such a structure as illustrated in FIGS. 1, 24 and 25 wherein each of the button slides 1 is adapted to be guided by guide members 237 relative to the top plate 3 and by a guide projection 234 formed on the guide 14 engaged with a slot 233 formed on the baseplate 10. Thus, the button slide 1 is adapted to be guided at two positions thereof, above and under the slide 1. Since the button slide 1 is guided by the guide projection 234 at a position under the button slide 1 where the setting pin 11 of the setting member 12 extends downwardly, the button slide 1 is not tilted when the pin 11 acts on the link member 6. Thus, accurate selection and tuning without substantial tuning error can be positively obtained. The set direction of the setting member 12 relative to the button slide 1 may be changed freely. A stable setting can be attained without spoiling other desirable functions of the tuner only by extending the guide 14 downwardly to form the guide projection 234.

A tuning operating mechanism with a clutch employable for the pushbutton tuner of the present invention will now be explained. In the pushbutton tuner, it is general that a tuning operation system is normally established by a manual rotary tuning shaft and the system is released when a push button is operated to allow instantaneous establishment of a pushbutton tuning operation system. To this end, a clutch mechanism is generally incorporated in the operation system by the manual rotary tuning shaft. A known clutch mechanism widely used is so formed that a pinion provided at a tip end of the rotary tuning shaft may be engaged with and disengaged from a crown gear through a clutch plate relative to a rotary disc interlocked with a rotary crank for displacing a core slide. The clutch plate and the crown gear are normally pressed against the rotary disc by the action of a coil spring to establish a tuning operation system by a manual rotary tuning shaft. When a pushbutton operation is carried out, a separately provided member such as a kick arm is actuated and the actuation is conveyed to the clutch lever to release interlocking between the clutch member and the crown gear and the rotary disc through suitable interlocking mechanism. This construction, however, requires bulky operating members such as the rotary crank. Furthermore, when the push button is depressed, an operating mechanism is required to operate such a large rotary crank and the kick arm together with a core slide, so that an operational resistance becomes considerably high. In addition, a rubber type frictional plate employed as a material for the clutch plate has disadvantages that it lacks accuracy in a clutch operation possibly causing a tuning error and it is poor in weatherability and a wear-resistance.

Figure 21:
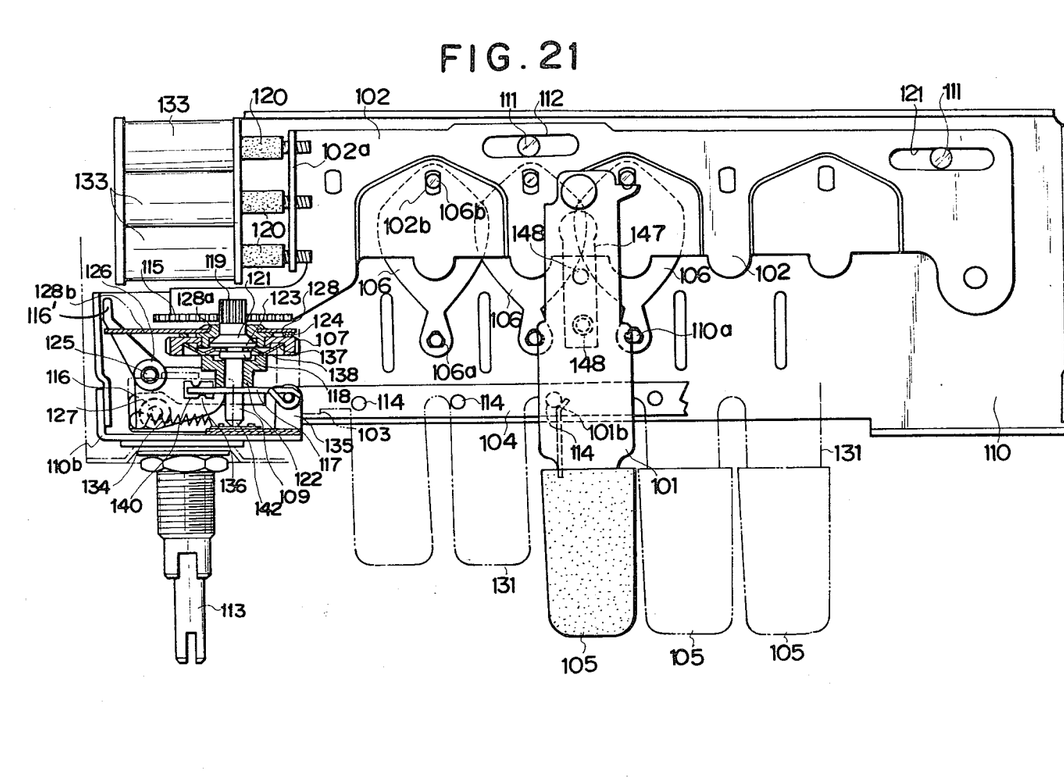
FIG. 21 is a partly cut-away plan view of a pushbutton tuner in accordance with the present invention, particularly illustrating a tuning operating mechanism thereof.
Figure 22:
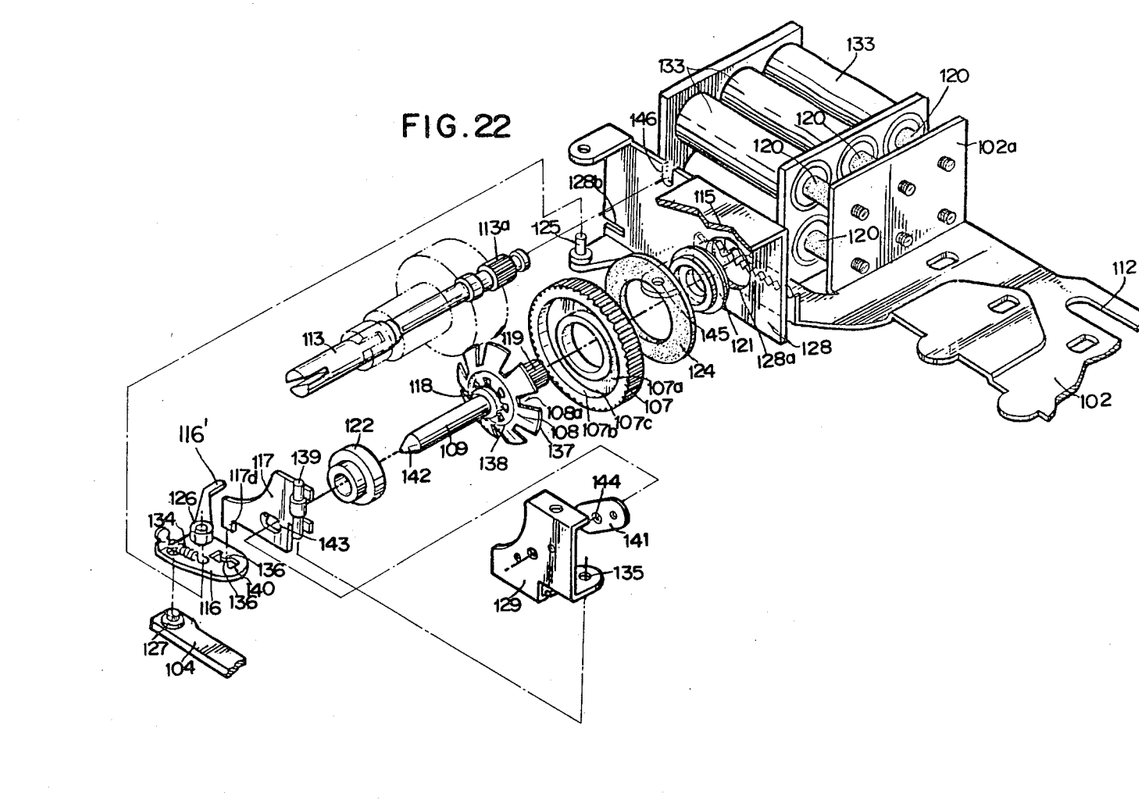
FIG. 22 is an exploded perspective view of the tuning operating mechanism illustrated in FIG. 21.
Figure 23:
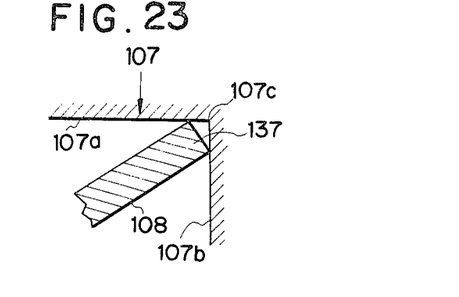
FIG. 23 is a fragmentary enlarged sectional view, showing an operational relation between a clutch member and a clutch lever forming part of the tuner.

In FIG. 21, a core slide 102 has an upright seat portion 102a formed at one side portion of the core slide 102. Cores 120 are fixed to said seat portion 102a and inserted in coils 133 provided on a baseplate 110 respectively. Upon rightward or leftward displacement of the core slide 102, the cores 120 is moved into or out of the respective coils to accomplish a desired tuning operation. Separately from such a tuning operation system by push buttons 105, there is provided a tuning operating system by a manual rotary tuning shaft 113. More specifically, the tuning shaft 113 has at a tip end portion thereof a pinion 113a as illustrated in FIGS. 22. The pinion 113a is meshable with a clutch gear 107. On the other hand, a main shaft 109 mounted coaxially with the clutch gear 107 has a pinion 119 which is meshable with a rack 115 formed on one side of the core slide 102. Therefore, when the tuning shaft 113 is rotated, the core slide 102 is displaced bit by bit leftwardly or rightwardly to attain a desired tuning.

In the so arranged tuning operating mechanism, a clutch mechanism is provided for switching the tuning operating system by the tuning shaft 113 to that by the push buttons 105 or vice versa. More specifically the clutch gear 107 has on one side thereof an annular recessed portion having an inner, flat, axially facing end wall 107a, a cylindrical side wall 107b and an annular corner 107c defined between the end wall 107a and the side wall 107b. Within the annular recessed portion there is received a resilient clutch member 108 which is fixed on the main shaft 109 by a flange 118 and a boss 123 provided oppositely to the flange 118. The clutch member 108 has notches 108a on a peripheral portion 137 thereof to assure its resiliency at the point it engages with the clutch gear annular corner 107c. The clutch member 108 further has an annular apex 138 formed by bending the central portion of the clutch member 108 and adapted to abut against a thrust collar 122 slidably mounted on the main shaft 109. The main shaft 109 is supported at one end thereof by a bushing, 121 which is fitted in an opening 128a of a support bracket 128 of the baseplate 110, and rotatably supported at the opposite needle-pointed end 142 by an auxiliary bracket 129 attached to a bent portion 110b of the baseplate 110, as illustrated in FIG. 21. The main shaft passes through the collar 122, and the pointed end 142 passes into an opening 143 of the clutch lever 117 and an opening 144 of a bearing member 141. A friction member 124 made of a resilient material, such as a rubber etc. or a material having roughed surfaces, is interposed between thend 142 passes into an opening 143 of the clutch lever 117 and an opening 144 of a bearing member 141. A friction member 124 made of a resilient material, such as a rubber etc. or a material having roughed surfaces, is interposed between the support bracket 128 and the clutch gear 107.

The clutch lever 117 has at a base portion thereof a pin 139, whose upper end is supported by a bearing portion 145 extending from the support bracket 128 and whose lower end is supported by a bearing portion 135 of the auxiliary bracket 129. The clutch lever 117 has at a free end thereof at its lower portion a projection 117d, which is fitted in a slot 140 formed at one end portion of a clutch link 116. The slot 140 has a contour defined by arcuate projections 136 and 136 formed oppositely. The projection 117d, is disposed in the slot 140 within a space between the two projections 136 and 136 to convey actuation of the link 116 to the lever 117. The clutch link 116 has a cylindrical opening portion 126 which is adapted to receive a pivotal pin 125 of the support bracket 128 so as to rotate around the opening. This rotation is also attained by connecting a pin 127 of a kick arm 104 to the clutch link 116. As apparent from FIG. 21, the kick arm 104 is provided so as to extend laterally covering all the area where the button slides 101 are disposed and formed in a thin strip attached along the front of the base plate 110. A spring 134 urges the clutch link and kick arms 104 attached thereto into a stable position. The kick arm 104 has projections 114 at positions corresponding to the respective button slides 101, which are engageable with engaging portions 101b of the button slides 101, respectively. Upon depression of the push button 105, the engaging portion 101b acts on the projection 114 to displace the kick arm 104 leftwardly in FIG. 21. The clutch link 116 is then rotated clockwise as viewed in FIG. 21. An arm 116' is fitted around the pin 125, and when the clutch link 116 is rotated, a switch (not shown) is operated. As the clutch link 116 is rotated clockwise on the pin 125, the clutch lever 117 is thus pivoted on the axis of pin 139 in a direction to release the pressing of the clutch member 108 against the friction member 124 for effecting a clutch changeover operation.

Thus, the tuning operating mechanism, in accordance with the present invention, includes the clutch gear 107 mounted coaxially with the main shaft 109 and the resilient clutch member 108 mounted on the main shaft 109 with the clutch member periphery 137 being positioned in the clutch gear corner 107c and the central annular clutch member apex 138 abutted by the collar 122 operable by the clutch lever 117. Pressing means, such as a coil spring etc., is not required, so that the clutch mechanism may be formed so compact that it can be provided substantially within the region of the clutch gear 107. Furthermore, the engagement of the resilient periphery of the clutch member 108 with the clutch gear corner 107c provides reliable clutch operation even under large changes in temperature or humidity. In addition, the clutch member 108 has a configuration which allows it to be made at low cost of inexpensive sheet material. As a result, a tuning operating mechanism suitable for a small-sized and thinned pushbutton tuner can be provided at a low cost.

We claim:

1. In a pushbutton tuner which comprises: a baseplate; a plurality of button slides arranged in a plane parallel with a major face of the baseplate; setting pins provided to the button slides, respectively; a plurality of link members pivotally supported with respect to said major face of the baseplate, a plane parallel therewith, a tuning mechanism; and a memory slide engaged with said link members for operating said tuning mechanism; said memory slide being displaceable upon rotation of any of the link members which has been actuated through an engagement thereof with the associated setting pin in response to depression of the associated button slide; the improvement wherein each of said link members have oppositely angled edges on opposite sides thereof, and each of said setting pins being adapted to act on the confronting edges of the respective adjacent two link members to pivot the same.

2. A pushbutton tuner as set forth in claim 1, wherein said link members are arranged with their respective engaging edges overlapping each other and said memory slide has raised portions for allowing the portions where the link members are pivotally connected to the memory slide to be formed above the memory slide at heights according to the heights of the respective link members.

3. A pushbutton tuner as set forth in claim 1, wherein said oppositely angled edges of each of said link members are formed on the same circle and the spacing between said confronting engaging edges of the respective adjacent two link members is less than the width of the setting pin.

4. A pushbutton tuner as set forth in claim 1, wherein each of said link members has an engaging projection, formed integrally therewith, for engaging with said memory slide and said memory slide has an elongated slot engageable with said engaging projection.

5. In a pushbutton tuner which comprises: a baseplate; a plurality of button slides arranged within a plane in parallel with a major face of the baseplate; setting pins provided on the button slides, respectively; a plurality of link members pivotally supported on said major face of the baseplate within a plane or planes in parallel therewith in relation with the respective button slides, the improvement wherein each of said link members has a large-headed pin provided thereon for engaging with said memory slide, and said memory slide has an elongated slot for engaging with each of said pins which slot has an enlarged portion for allowing the large-headed portion of the pin to be put into the slot therethrough.

6. A pushbutton tuner having a tuning mechanism, pushbutton tuning operating means for operating said tuning mechanism upon selective depression of pushbuttons, manual tuning operating means having a rotary shaft which is adapted to be manually actuated to operate said tuning mechanism, and a clutch mechanism incorporated in said manual tuning operating means for disconnecting said rotary shaft so as to allow the pushbutton tuning operating means to carry out a desired tuning operation, which tuner is characterized by the clutch mechanism comprising: a main shaft, a clutch gear fitted around said main shaft which clutch gear is normally coupled to said first rotary shaft; a resilient clutch member on said main shaft which must rotate with said clutch gear to effect a tuning operation; and clutch operating means; said clutch gear having on one side thereof a recess having an annular corner; said resilient clutch member having a resilient peripheral portion normally urged against said annular corner of the clutch gear; said clutch operating means being connected to said main shaft for normally press said resilient peripheral portion against said annular corner and releasing the same when a pushbutton is depressed.

7. A pushbutton tuner as set forth in claim 6, wherein said pushbutton tuning operating means comprises a baseplate, a plurality of button slides each having a pushbutton secured to respective one end and arranged within a plane in parallel with the baseplate, setting pins provided on the respective button slides, a plurality of link members pivotally supported on the baseplate within a plane or planes in parallel therewith in relation with the respective button slides, each of said link members having oppositely angled edges on opposite sides thereof, each of said setting pins being adapted to act on the confronting edges of the respective adjacent two link members to pivot the same, and a memory slide engaged with said link members for actuating said tuning mechanism, said memory slide being displaceable upon rotation of any of the link members which has been actuated through an engagement thereof with the associated setting pin in response to depression of the associated button slide.

8. A pushbutton tuner as set forth in claim 6 wherein said clutch operating means includes a slidable kick arm and a clutch link engaged with said kick arm, said clutch link having an engaging slot contoured by oppositely formed arcuate projections and said clutch lever having a projected portion adated to be disposed within a space between said arcuate projections thereby to convey actuation of the kick arm to the clutch lever.

9. The pushbutton tuner of claims 1, 2, 3 or 7, wherein each adjacent pair of link members respectively extends on opposite sides of each button slide, with the opposite sides of each of said link members respectively being engageable by the setting pins of adjacent link members so that the number of link members needed is one more than the number of pushbutton slides.

10. A clutch operating mechanism for use in a tuning operating mechanism for a pushbutton tuner which comprises:
   a main shaft;
   a clutch gear fitted around the main shaft;
   a resilient clutch member;
   a clutch lever; and
   a thrust collar;
   said clutch gear having on one side thereof an annular recess having an annular corner;
   said resilient clutch member having at a central portion thereof an annular apex and having a peripheral portion directed towards said annular corner of the clutch gear;
   said clutch lever being mounted on said main shaft for operating said thrust collar to press said thrust collar against said annular apex.

* * * * *